US006183843B1

United States Patent
Feng et al.

(10) Patent No.: US 6,183,843 B1
(45) Date of Patent: Feb. 6, 2001

(54) METHOD FOR PRODUCING LOW REFLECTANCE DIAMOND AND PRODUCTS THEREFOR

(75) Inventors: Tom Feng, Hopewell Junction, NY (US); Joel Askinazi, Trumbull, CT (US)

(73) Assignee: Raytheon Company, Lexington, MA (US)

( * ) Notice: Under 35 U.S.C. 154(b), the term of this patent shall be extended for 0 days.

(21) Appl. No.: 08/077,334

(22) Filed: Jun. 15, 1993

Related U.S. Application Data

(63) Continuation-in-part of application No. 07/804,871, filed on Dec. 6, 1991.

(51) Int. Cl.[7] ................................................. B32B 17/06
(52) U.S. Cl. ........................... 428/212; 428/408; 428/457
(58) Field of Search ........................ 106/286.1; 428/408, 428/446, 457, 212, 913

(56) References Cited

U.S. PATENT DOCUMENTS

| 4,383,728 | * | 5/1983 | Litington | 359/359 |
| 4,842,937 | * | 6/1989 | Meyer et al. | 428/408 |
| 4,932,331 | * | 6/1990 | Kurihara et al. | 106/286.1 |

FOREIGN PATENT DOCUMENTS 61-163273  *  7/1986  (JP) .

OTHER PUBLICATIONS

Liou et al "Low Temperature Diamond Deposition on Glass" SPIE vol. 1146 Diamond Optics II (1989) p. 12–20.*
Deutchman et al "Dual Ion Beam Deposition of Diamond Films on Optical Elements" SPIE vol. 1146 Diamond Optics (1989) p. 124–134.*

* cited by examiner

Primary Examiner—Archene Turner
(74) Attorney, Agent, or Firm—William C. Schubert; Glenn H. Lenzen, Jr.

(57) ABSTRACT

Method for producing novel diamond bodies having near-surface areas of reduced index of refraction which act as an anti-reflection layer. The method comprises displacing some of the ions present in the diamond lattice structure at said areas with preselected ions, such as of C, Si, Fe, Ni, Ti or Au, by ion implantation means to produce desired optical properties, such as for lens coatings. The ion-implanted diamond body preferably is subjected to high temperature post-annealing.

10 Claims, 1 Drawing Sheet

METHOD FOR PRODUCING LOW REFLECTANCE DIAMOND AND PRODUCTS THEREFOR

This is a continuation of application Ser. No. 07/804,871, filed Dec. 6, 1991

BACKGROUND OF THE INVENTION

1. Field of the Invention

The present invention relates to the use of diamond for various applications, such as chemical vapor-deposited (CVD) synthetic diamond coatings applied to a variety of light-transmissive substrates or free-standing bulk diamond. Diamond possesses unique superior properties including hardness, chemical inertness, and optical transparency from the ultra-violet to the far-infrared, which make it an ideal optical material for use as a protective optical coating material, an IR window, a missile or spacecraft dome or window and/or other utility in which severe environmental conditions of high-speed rain erosion and particle impact, aerodynamic heating and chemical attack problems may be encountered.

While diamond possesses the aforementioned superior properties which are highly desirable, it also has a high refraction index of about 2.4, which causes diamonds to reflect back about 30% of the incident light which strikes the surfaces thereof. While this property causes diamonds to sparkle or flash back reflected light to a high degree and to be extremely valuable as gems, it detracts seriously from the use of diamond as a protective optical material in which high optical transmission properties are desirable.

2. Discussion of the Prior Art

It is known that the reflective losses of optically transparent materials can be reduced by applying to the surface thereof antireflection coatings. While such coatings could be applied to a diamond surface, to reduce or eliminate light reflection, this would also nullify some of the necessary properties which justify the expense of using diamond, namely the surface hardness, temperature resistance, etc., responsible for the protective properties afforded by diamond. Moreover, there is a problem of providing a sufficient bond between diamond and an antireflective coating to withstand extreme environmental conditions. Other light-transmissive materials having lower refraction indexes are used as optical windows, such as quartz, glass, sapphire, etc., but the protective properties of such materials are far inferior to those of diamond, and they are not transparent in the mid- and far-infrared regions.

It is known that the optical properties of amorphous materials, such as silica glass, can be modified by ion implantation to increase the index of refraction of the glass and thus produce optical waveguides having controlled, reproducible light reflective properties. It is also known that such ion implantation is not effective for this purpose on certain materials, such as crystalline quartz and certain lithium ferroelectrics, since ion implantation was found to reduce the index of refraction thereof rather than increase the index as desired. Reference is made to the Treatise On Materials Science And Technology, published by Academic Press, Inc. (1980), Volume 18, pages 1 to 7 and 445–459.

SUMMARY OF THE INVENTION

The present invention relates to diamond surfaces that are changed, altered or radiation-damaged by ion implantation to change the chemical composition of the near-surface region of diamond in a manner which lowers the refractive index of the diamond. This makes it possible to reduce the reflectance of diamond surfaces by creating an antireflective surface stratum of ion-altered diamond material having a lower refractive index than the body of the diamond but retaining the desirable diamond properties of hardness, optical clarity, infrared-transparency, heat-resistance, etc.

Ion implantation is a known process for injecting atoms of any element into any solid material to selected depths and concentrations to form an alloy or other solid mixture that has a different composition from the original solid. The normally-reflective surfaces of diamond can be implanted with ions of certain materials, such as carbon, silicon, iron, nickel, titanium and gold, to reduce the refractive index of the diamond while retaining the desirable protective and optical properties of the diamond and reducing the reflection properties thereof.

According to a preferred embodiment of this invention, the degree of ion implantation can be controlled to produce a graded antireflective surface stratum having a tailored refractive index which increases gradually inwardly from the treated surface.

According to another preferred embodiment, the ion-implanted diamond body is heat-treated or annealed to diffuse or redistribute the ions and anneal out some of the surface defects imparted by the ion-implantation step, whereby the refractive index of the diamond can be tailored according to the particular transmission wavelength range desired for the particular utility to which the altered diamond body or coating is to be applied.

DETAILED DESCRIPTION OF THE INVENTION

Ion implantation differs from chemical vapor deposition, ion plating or other film deposition processes in that it involves the actual modification, alteration or intentional damaging of the crystalline lattice of the diamond in the near-surface areas with certain source material ions which produce altered surface areas having a different, lower index of refraction than the pure diamond body. Hence an altered diamond layer or coating can be produced having a predetermined index of refraction which is tailored to a lower value required for a particular utility. In CVD, ion plating or other film deposition processes, the index of refraction of the substrate is not directly altered but rather is masked by a surface layer of coating which then becomes the exposed surface of the substrate so long as it remains bonded to the substrate and, in the case of a diamond substrate, nullifies the desirable protective surface properties of the substrate.

Figure 1:
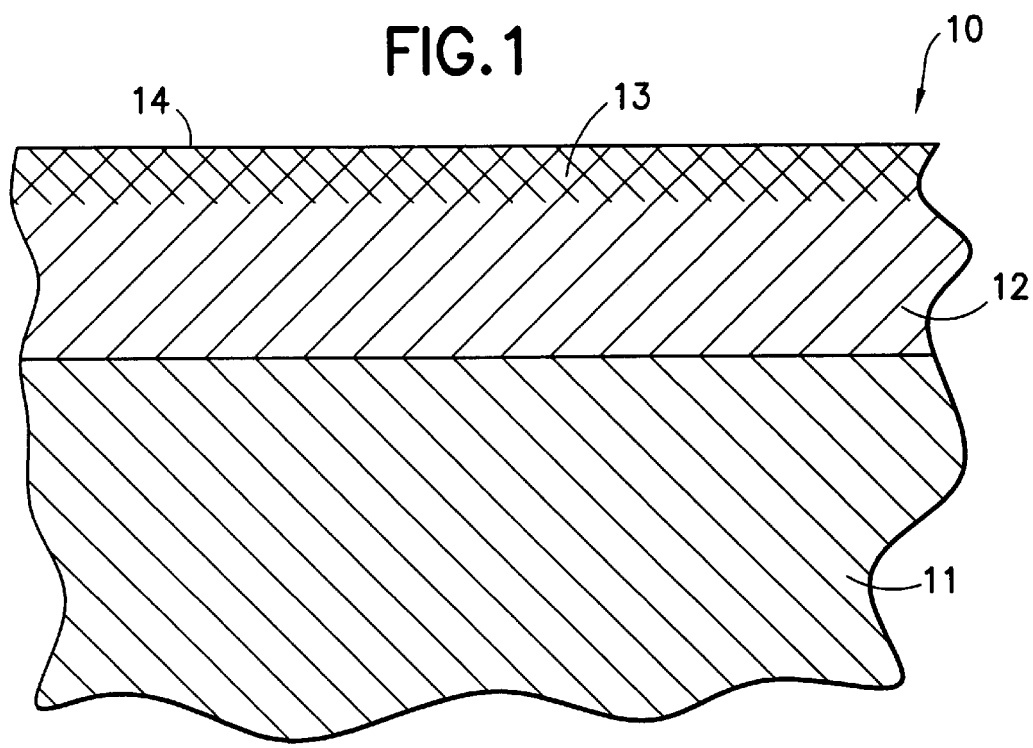
FIG. 1 is a diagrammatic cross-section to an enlarged scale of a diamond body embodying the principles of the present invention.
Figure 2:
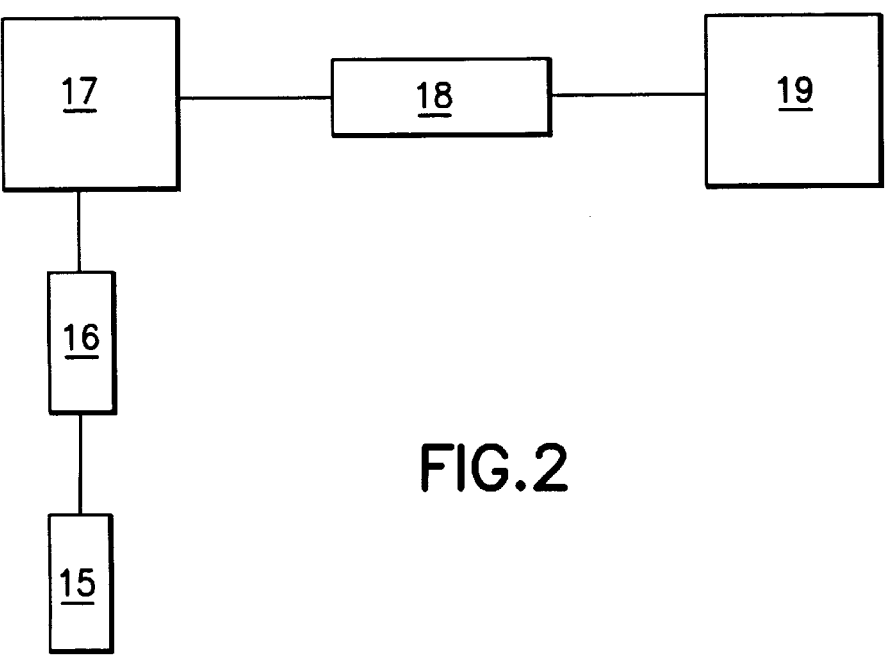
FIG. 2 is a block form representation of a conventional ion-implantation apparatus suitable for use according to the present invention.

Referring to FIG. 1 of the drawing, the diamond body 10 comprises a light-transmissive substrate 11 having deposited thereon a thin layer 12 of synthetic diamond. The near-surface area 13 of the diamond layer 12 is illustrated by cross-hatching which gradually decreases inwardly from the outer surface 14, as does the ion-displacement, to produce a graded antireflective surface stratum. If the diamond layer 12 is sufficiently thick (greater than 100 micrometers), then the supporting substrate 11 is not needed since the bulk diamond is free standing or self-supporting. Most commonly, however, particularly in the case of the diamond layers of large surface area, such layers are formed of CVD diamond on a supporting substrate in known manner. Ion implantation is accomplished by the use of a conventional ion-implantation accelerator apparatus as illustrated by FIG. 2 of the drawings. Such devices include an ion source 15, a vacuum energy chamber 16, a mass analyzer 17, an acceleration tube 18, and a target chamber 19, whereby desired ions can be generated from ion source 15 and directed against the surface of a desired target material within the chamber 19 with sufficient force to implant the ions into the lattice of the target material to the desired degree.

Since the ions to be implanted according to the present invention, namely C, Si, Fe, Ni, Ti and Au, are not gases, one embodiment of the present ion source is a sputter source. In such a source, in an inert gas such as argon, a glow discharge is generated and a potential difference is produced between the argon plasma and the sputtering target. The ions sputter off source atoms from the target and are then ionized by collisions with the electrons emitted from a filament.

Preferred source materials include solid pure bodies of materials desired to implant, such as pure graphite, silicon, iron, nickel, titanium, and gold. If the element to be ionized exists in a gaseous form (for example, carbon in the form of carbon dioxide), it can be introduced directly. The implanting ions pass through an orifice from the ion source 15 into a high vacuum energy region 16 where they are accelerated by an electric field from the extraction electrode to a moderate energy, such as 10–30 keV, and passed through a mass analyzer 17 comprising a magnetic field.

Since the ion beam from a source generally contains impurities, such as ions of the inert gas, from air and/or from contaminants, conventional ion implantation devices include a mass analyzer 17 which segregates ions according to mass. The apparatus is preset to permit the desired ions to be admitted to an acceleration tube 18 while blocking the passage of other undesired ions.

The acceleration tube 18 provides an evacuated path to focus the flux of ions to be implanted, and an electric field to accelerate the ions to the desired energy for implanting them to the desired depth inside the diamond. The target chamber 19 provides a line-of-sight, high vacuum access to each area of the surface of the diamond target material to be ion-implanted. Conventional target chambers 19 include ion-beam-current integration, by which the dose is measured; secondary-electron supression, to avoid ion-beam-current errors; vacuum pumping to inhibit target contamination; beam sweeping, to scan the diamond target material; target manipulation, to expose every desired surface area of the diamond to the ion beam, target cooling and automatic target changing means among other conventional features.

The most probable penetration depth of the implanted ions, referred to as the projected range depends on the type and energy of the ions and characteristics of the host material. In general, the concentration profile of the ions in the host material takes on a Gaussian distribution centered on the projected range. However, the final distribution profile can be tailored to the desired shape by adopting multiple implantations at different energies and ion fluxes.

In the present invention, to achieve a graded refractive index in diamond (low-to-high index) multiple implants are employed where both the beam energy and the number of ions (flux) are successively increased. Such a treatment will result in a concentration profile that is nearly constant just below the surface and then gradually falls off with depth. In such a profile the refractive index is expected to increase gradually, resulting in a lower reflectance in the diamond because of a better optical index matching.

Preferably, the ion-implanted diamond is given a final heat treatment at from about 500°–1000° C. to diffuse or redistribute the ions and anneal out or heal some of the defects whereby the refractive index of the altered diamond is further modified up or down to tailor it to a particular wavelength range of interest.

While a limited number of specific source materials have been disclosed as preferred, it will be apparent to those skilled in the art that other metallic and non-metallic source materials can also be implanted according to the present invention to produce a reduction in the refractive index of diamond. As with Si, Fe, Ni, and Ti, the source ions may be reactive with the carbon of the diamond lattice to form carbides, causing a lowering of the refractive index of the diamond, or as with gold, the source ions may function primarily to induce lattice defects that will lower the refractive index of the diamond.

To produce a desired ion concentration profile in diamond, a range of ion energies are employed. The energies required are in the broad range of 10,000 to 500,000 eV, more preferably from 50,000 to 300,000 eV, applied normal to the surface being treated.

The total number of displaced and implanted ions depends upon the average displacement energy, the relative masses of the colliding ions and the dose or fluence of the implanted ions. The flux of incident ions is the number of ions per unit area per time unit striking the target and the dose is the integration of flux over time.

It is to be understood that the above described embodiments of the invention are illustrative only and that modifications throughout may occur to those skilled in the art. Accordingly, this invention is not to be regarded as limited to the embodiments disclosed herein but is to be limited as defined by the appended claims.

What is claimed is:

1. A diamond body comprising:
    a radiation altered diamond lattice structure in surface and near-surface areas of the diamond body, wherein at least some of the ions normally present in the diamond lattice structure are displaced with preselected ions and wherein the said preselected ions are most concentrated at the surface areas and decrease inwardly in said near-surface areas to provide a graded radiation altered diamond lattice structure and thereby a reduced index of refraction for the diamond body.

2. The diamond body according to claim 1 wherein said surface areas are exposed to a flux of said preselected displacement ions having an energy level between about 10,000 and 500,000 eV under ion implantation conditions to displace said ions in the crystal lattice structure at said surface areas with said displacement ions.

3. The diamond body according to claim 2 wherein said energy level is between about 50,000 and 300,000 eV.

4. The diamond body according to claim 2 wherein the diamond body is subjected to high temperature annealing during ion implantation in order to tailor the index of refraction to a predetermined desired value.

5. The diamond body according to claim 4 wherein the body is annealed at a temperature between about 500° C. and 1000° C.

6. The diamond body according to claim 2 wherein multiple ion implants are employed such that both ion beam energy and number of ions (flux of the ion beam) are varied in order to produce a gradually increasing refractive index towards the interior of the diamond.

7. The diamond body according to claim 6 wherein the ion flux and ion energy in the multiple implants are successively increased.

8. A diamond body according to claim 1 comprising a light-transmissive substrate having thereon a layer of synthetic diamond.

9. A diamond body according to claim 1 in which said preselected ions are selected from the group consisting of carbon, silicon, iron, nickel, titanium and gold.

10. A diamond body according to claim 1 in which said altered lattice structure is heat-annealed to produce a refractive index of predetermined desired value.

* * * * *